(12) United States Patent
Yu

(10) Patent No.: US 6,391,728 B1
(45) Date of Patent: May 21, 2002

(54) METHOD OF FORMING A HIGHLY LOCALIZED HALO PROFILE TO PREVENT PUNCH-THROUGH

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/804,165

(22) Filed: Mar. 12, 2001

(51) Int. Cl.[7] .............................................. H01L 21/336
(52) U.S. Cl. ....................... 438/291; 438/305; 438/486; 438/530
(58) Field of Search ................................. 438/289, 290, 438/291, 305, 407, 486, 528, 530

(56) References Cited

U.S. PATENT DOCUMENTS 5,885,886 A  *  3/1999  Lee ............................. 438/528
5,899,719 A  *  5/1999  Hong .......................... 438/291
6,300,205 B1 * 10/2001  Fulford et al. ............... 438/305

FOREIGN PATENT DOCUMENTS

JP          63-78521     *  4/1988

* cited by examiner

Primary Examiner—Chandra Chaudhari
(74) Attorney, Agent, or Firm—Foley & Lardner

(57) ABSTRACT

The disclosure describes an exemplary embodiment relating to a method of forming halo regions in an integrated circuit. This method includes forming dummy spacer structures over an integrated circuit substrate proximate lateral side walls of a gate structure, providing an oxide layer over the integrated circuit substrate, removing the dummy spacer structures to create windows in the oxide layer exposing the integrated circuit substrate, providing an amorphization implant through the windows to form amorphous regions in the integrated circuit substrate, providing a halo dopant implant through the windows to the amorphous regions, and recrystallizating the amorphous regions in the integrated circuit substrate to form halo regions.

20 Claims, 3 Drawing Sheets

METHOD OF FORMING A HIGHLY LOCALIZED HALO PROFILE TO PREVENT PUNCH-THROUGH

CROSS REFERENCE TO RELATED APPLICATION

The present application is related to U.S. application Ser. No. 09/255,546, by Yu, et al., entitled "Locally Confined Deep Pocket Process for ULSI"; U.S. Pat. No. 5,985,726, by Yu, et al., entitled "Damascene Process for Forming Ultra-Shallow Source/Drain Extensions and Pocket in ULSI MOSFET", all of which are assigned to the assignee of the present application.

FIELD OF THE INVENTION

The present specification relates generally to a method of fabricating an integrated circuit. More particularly, the present specification relates to a method of forming a highly localized halo profile to prevent punch-through.

BACKGROUND OF THE INVENTION

Integrated circuits (ICs), such as, ultra-large scale integrated (ULSI) circuits, can include as many as one million transistors or more. In such large ICs, the channel length of transistors, such as metal oxide semiconductor field effect transistors (MOSFETs) must be minimized. Minimization of the channel length allows greater number of transistors to be fabricated on a single substrate and also provides for a faster transistor switching speed due to the reduced capacitance and resistance between the source and the drain regions.

One of the major difficulties with reducing the channel length is "punch-through", in which depletion layers from the source and drain regions contact one another, causing the potential barrier between the source and the drain to decrease. Punch-through results in significant leakage current, even when the transistor is in the off state.

The punch-through voltage (Vpt) of a device is defined as the drain-to-source voltage (Vds) at which the current from drain to source (Ids) reaches an unacceptable value with a gate-to-source voltage (Vgs) of zero. Punch-through is conventionally suppressed in a device to the point where Vpt is larger than any possible Vds. One method for suppressing Vpt is to increase the concentration of dopants in the drain and source regions to decrease the depletion layer widths. Typically, this increased concentration of. dopants is used along with a threshold voltage adjust (Vt-adjust) implant. A Vt-adjust implant is a region of increased doping, e.g. phosphorous in N-channel MOSFETs, boron in P-channel MOSFETs. Other dopants for the Vt-adjust implant can include indium and boron difluoride ($BF_2$). The Vt-adjust implant is typically implanted beneath the channel region to raise the dopant concentration beneath the channel region above the dopant concentration of the substrate. However, during the subsequent thermal annealing process, the dopant from this Vt-adjust implant may diffuse toward the surface and raise the dopant concentration in the channel, causing carrier mobility degradation due to increased impurity scattering.

Another method for suppressing Vpt is using "halo" implants. P-type dopants (in N-channel MOSFETs) are implanted under the lightly doped drain/source extensions (e.g., tip regions of the drain and source regions.) The implanted dopant raises the doping concentration only on the walls of the source and drain regions near the surface channel region. Thus, the channel length can be decreased without needing to use a substrate doped to a higher concentration. However, "halo" implants must be fabricated with great precision and may also result in an increase in the sidewall junction capacitance.

Ideally, halo implants should be locally confined near the source/channel and the drain/channel junctions. The requirement of this tight confinement for halo implants is particularly important as the MOSFET channel length continues to shrink in size. In conventional CMOS fabrication processes, halo implants are implemented by ion implantation and subsequent thermal anneal activation. However, due to the transient enhanced diffusion (TED) effect, the dopant thermal diffusion is present, making the halo profile less confined.

Accordingly, there is a need for a method of forming highly localized halo profiles with greater precision. Further, there is a need for an improved method of suppressing punch-through in an integrated circuit. Even further still, there is a need for a method of forming halo implants after other thermal anneal processes are performed such that no additional thermal budget is added to the halo profile.

The teachings here and below extend to those embodiments which fall within the scope of the appended claims, regardless of whether they accomplish one or more of the above-mentioned needs.

SUMMARY OF THE INVENTION

An exemplary embodiment relates to a method of forming halo regions in an integrated circuit. This method can include forming dummy spacer structures over an integrated circuit substrate proximate lateral side walls of a gate structure, providing an oxide layer over the integrated circuit substrate, removing the dummy spacer structures to create windows in the oxide layer exposing the integrated circuit substrate, providing an amorphization implant through the windows to form amorphous regions in the integrated circuit substrate, providing a halo dopant implant through the windows to the amorphous regions, and recrystallizating the amorphous regions in the integrated circuit substrate to form halo regions.

Another exemplary embodiment relates to a method of fabricating an integrated circuit which suppresses punch-through between a source and drain junction using a halo implant activated by a low temperature anneal. This method can include providing windows in an oxide layer-disposed over an integrated circuit substrate where the windows are located over a source and channel junction and a drain and channel junction in the integrated circuit substrate, using the windows to implant a species to create amorphous regions in the integrated circuit substrate proximate the source and channel junction and the drain and channel junction, using the windows to implant a halo dopant in the created amorphous regions, and activating the implanted halo dopant. The activated implanted-halo dopant forms halo regions localized near the source and channel junction and the drain and channel junction. The halo regions suppress punch-through effects.

Another exemplary embodiment relates to a method of forming a highly localized halo profile by a laser thermal process. This method includes forming an integrated circuit portion having source and drain regions in an integrated circuit substrate, a gate structure disposed between the source and drain regions, source and drain extensions extending from the source and drain regions to at least partially under the gate structure, and spacer structures located proximate lateral side walls of the gate structure and over the source and drain extensions. The method further includes depositing an oxide layer over the integrated circuit portion, removing the spacer structures, and forming halo regions localized in the integrated circuit substrate proximate the source and drain extensions. The halo regions have a halo dopant activated by recrystallization of an amorphous region.

Other features and advantages of embodiments of the present invention will become apparent to those skilled in the art upon review of the following drawings, the detailed description, and the appended claims.

BRIEF DESCRIPTION OF THE DRAWINGS

The invention is illustrated by way of example and not limitation in the figures of the accompanying drawings, in which like references indicate similar elements and in which.

DETAILED DESCRIPTION OF THE EXEMPLARY EMBODIMENTS

Figure 1:
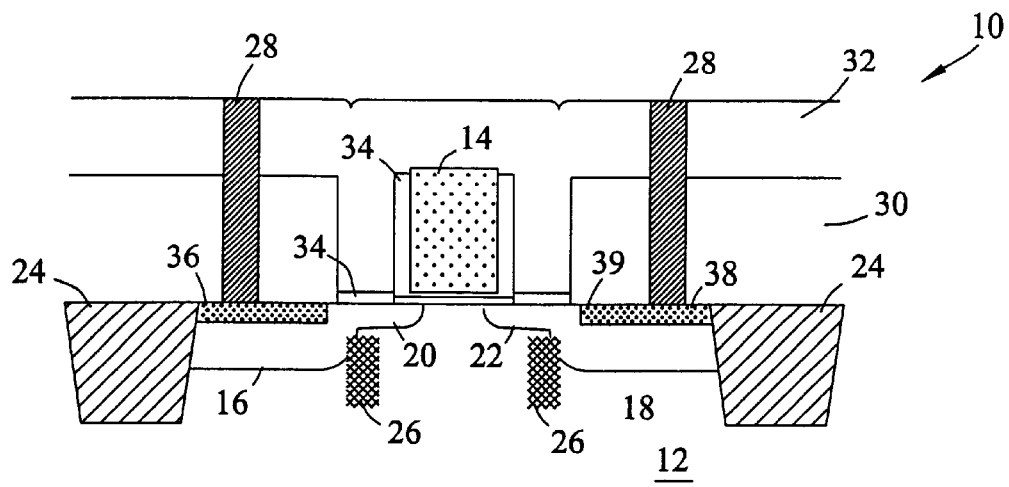
FIG. 1 is a schematic cross-sectional view representation of a portion of an integrated circuit having highly localized halo implants in accordance with an exemplary embodiment.

Referring to FIG. 1, a portion 10 of an integrated circuit (IC) or chip includes a substrate 12, a gate stack 14, a source region 16, a drain region 18, a source extension 20, a drain extension 22, isolation structures 24, halo regions 26, contacts 28, an oxide layer 30, an oxide layer 32, and a liner layer 34. Portion 10 is preferably part of an ultra-large-scale integrated (ULSI) circuit having millions or more transistors. Portion 10 is manufactured as part of the IC on a semiconductor wafer, such as, a silicon wafer.

Substrate 12 is any of a variety of semiconductor materials, such as, silicon. Substrate 12 can be a bulk P-type substrate or a silicon-on-insulator substrate. Substrate 12 can be a single crystal silicon oriented in a 100 direction.

In an exemplary embodiment, gate stack 14 includes a polysilicon gate electrode disposed over a gate dielectric or insulator, such as, thermally grown silicon dioxide. Gate stack 14 is aligned between active regions in substrate 12. Active regions are areas in portion 10 including impurities or dopants such as a p-type dopant (e.g., boron) or an n-type dopant (e.g., phosphorus). In an exemplary embodiment, active regions in portion 10 include source region 16, drain region 18, source extension 20, and drain extension 22.

Source region 16, drain region 18, source extension 20, and drain extension 22 can be formed by ion implantation. Halo regions 26 are located below extensions 20 and 22. The dopants in halo regions 26, source region 16, drain region 18, source extension 20, and drain extension 22 are advantageously activated by low temperature thermal activation or annealing processes further described below with reference to FIGS. 1–8.

Isolation structures 24 can be any of a variety of insulative materials which electrically isolate portion 10 from other portions on an integrated circuit wafer. Contacts 28 can be any of a variety of electrically conductive or semiconductive materials which provide an electrical contact to source region 16 and drain region 18. In an exemplary embodiment, contacts 28 are coupled to source region 16 and drain region 18 by layers of silicide 36 and 38. Layers of silicide 36 and 38 are located within source region 16 and drain region 18.

Source extension 20 is a shallower extension of source region 16. Drain extension 22 is a shallower extension of drain region 18. In an exemplary embodiment, source extension 20 and drain extension 22 extend at least partially below gate stack 14. In one embodiment, extensions 20 and 22 can be 20–40 nm deep (e.g., below a top surface 39 of substrate 12) and the width of each extension region can be 30–50 Angstroms.

Oxide layer 30 and oxide layer 32 can be any of a variety of oxide materials. In an exemplary embodiment, oxide layer 30 can be disposed over substrate 12 and oxide layer 32 can be disposed over oxide layer 30 and gate stack 14. Liner layer 34 can be any of a variety of different oxide or dielectric materials, such as, $SiO_2$. In an exemplary embodiment, liner layer 34 is located along lateral side walls of gate stack 14 and a top surface 39 above source extension 20 and drain extension 22.

Advantageously, halo regions 26 are implanted after other high temperature thermal anneal processes are completed. As such, halo regions 26 do not require additional thermal budget. By using a low thermal budget, more localized halo profiles can be obtained, which is desirable for transistors with small dimensions.

An exemplary method of forming portion 10 is described below with reference to FIGS. 1–8. The method advantageously forms portion 10 including halo regions 26 which are configured to prevent punch-through.

Figure 2:
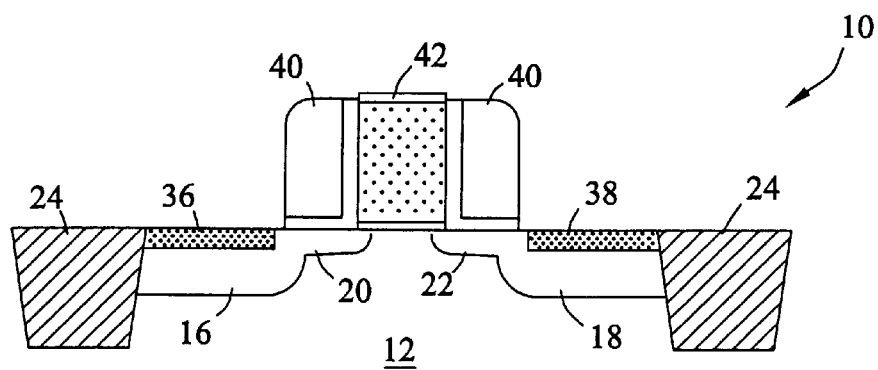
FIG. 2 is a schematic cross-sectional view representation of the portion of the integrated circuit illustrated in FIG. 1, showing a step in the fabrication process.
Figure 3:
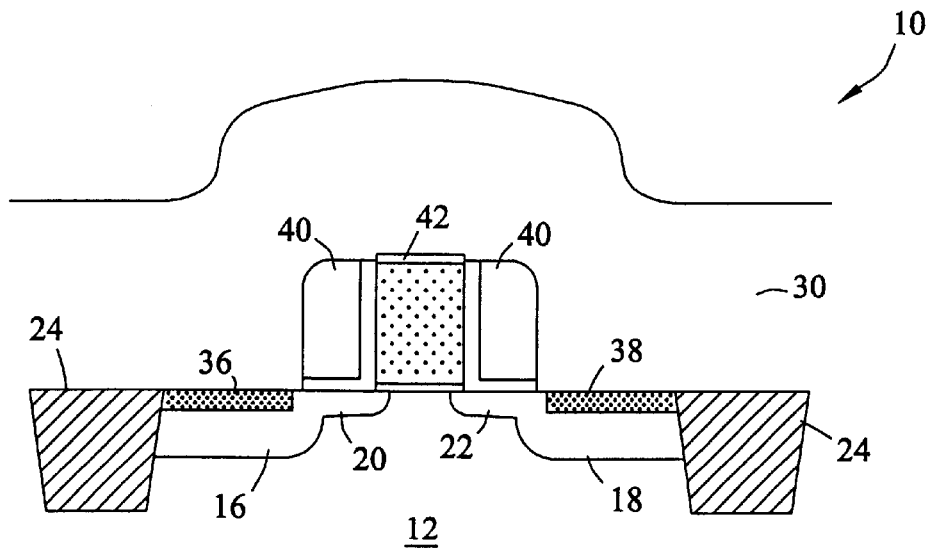
FIG. 3 is a schematic cross-sectional view representation of the portion of the integrated circuit illustrated in FIG. 1, showing an oxide deposition step.
Figure 4:
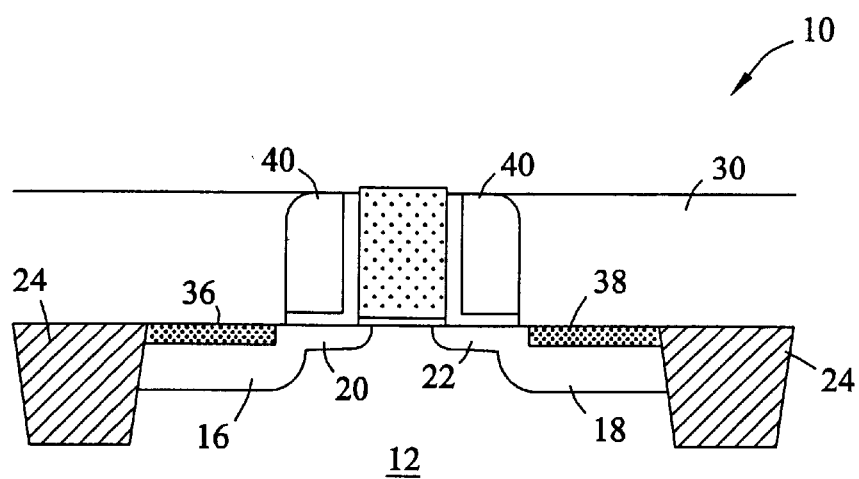
FIG. 4 is a schematic cross-sectional view representation of the portion of the integrated circuit illustrated in FIG. 1, showing a polishing step.

In FIG. 2, a cross-sectional view schematic of portion 10 illustrates portion 10 after a conventional CMOS fabrication process to form isolation structures 24, gate stack 14, source extension 20, drain extension 22, source region 16, drain region 18, silicide layer 36, silicide layer 38, liner layer 34, spacers 40, and a cap layer 42. In an exemplary embodiment, isolation structures 24 are formed in a shallow trench isolation (STI) formation process. Spacers 40 can be nitride spacers, such as, a spacer structure including $Si_3N_4$. Liner layer 34 can have a thickness of 50–70 Angstroms. Cap layer 42 can be SiON. p In FIG. 3, oxide layer 30 is provided. In an exemplary embodiment, oxide layer 30 is formed in a tetraethylorthosilicate (TEOS) process. In an exemplary embodiment, oxide layer 30 has a thickness of 3,000–4,000 Angstroms. In FIG. 4, a portion of oxide layer 30 is removed to expose gate stack 14. In an exemplary embodiment, a chemical-mechanical polishing process is used to remove away oxide layer 30.

Figure 5:
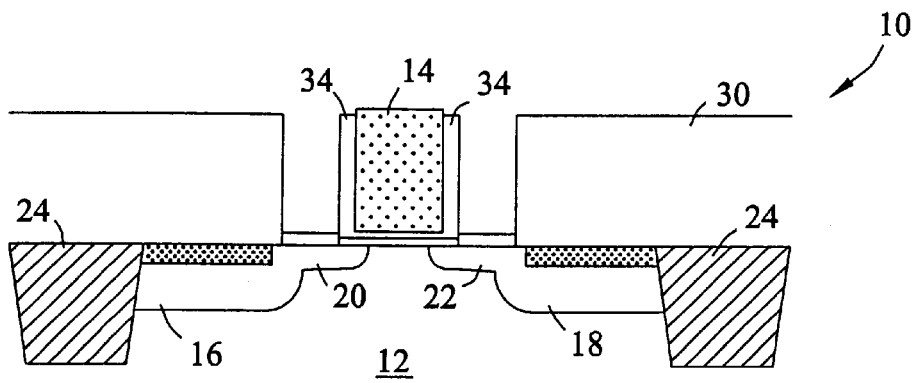
FIG. 5 is a schematic cross-sectional view representation of the portion of the integrated circuit illustrated in FIG. 1, showing a dummy spacer removal step.

In FIG. 5, spacers 40 are removed. In an exemplary embodiment, spacers 40 are removed using a wet etch process. Removal of spacers 40 creates a window through which halo regions 26 can be formed. The etching or removal process is selected to nitride, leaving oxide layer 30, gate stack 14 and liner layer 34 unaffected.

Figure 6:
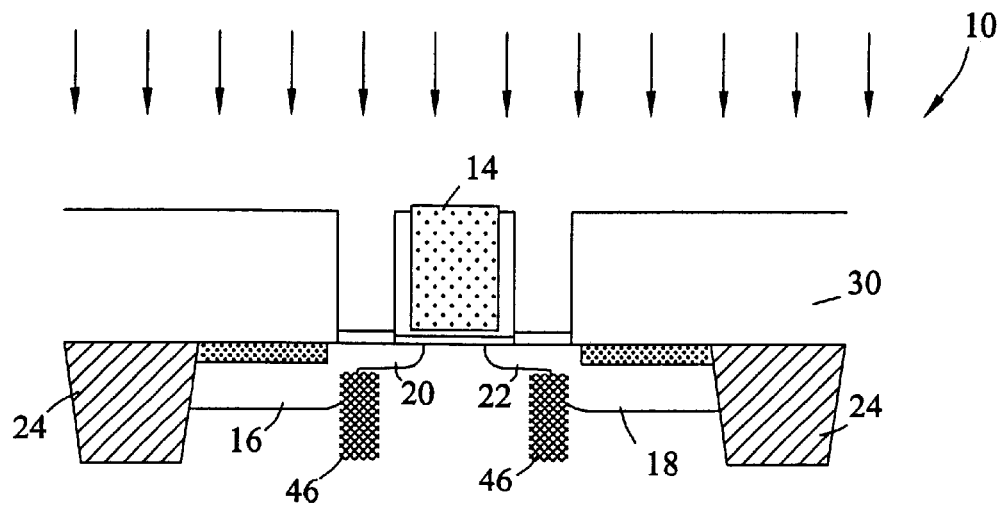
FIG. 6 is a schematic cross-sectional view representation of the portion of the integrated circuit illustrated in FIG. 1, showing a pre-amorphization implant and a halo dopant implant step.

In FIG. 6, a pre-amorphization implant is provided and then a halo dopant implant is performed. In an exemplary embodiment, the pre-amorphization implant can include any of a variety of species, such as, Ge, Si, or Xe. An exemplary embodiment, the vacant implant can include any of a variety of species, such as, antimony (Sb) and Indium. The pre-amorphization implant has an energization level of 10–100 $k_eV$. The halo dopant implant has an energization level of 10–100 $k_eV$. The center ranges of these two implants are designed roughly the same. The pre-amorphization implant creates amorphous regions 46.

Figure 7:
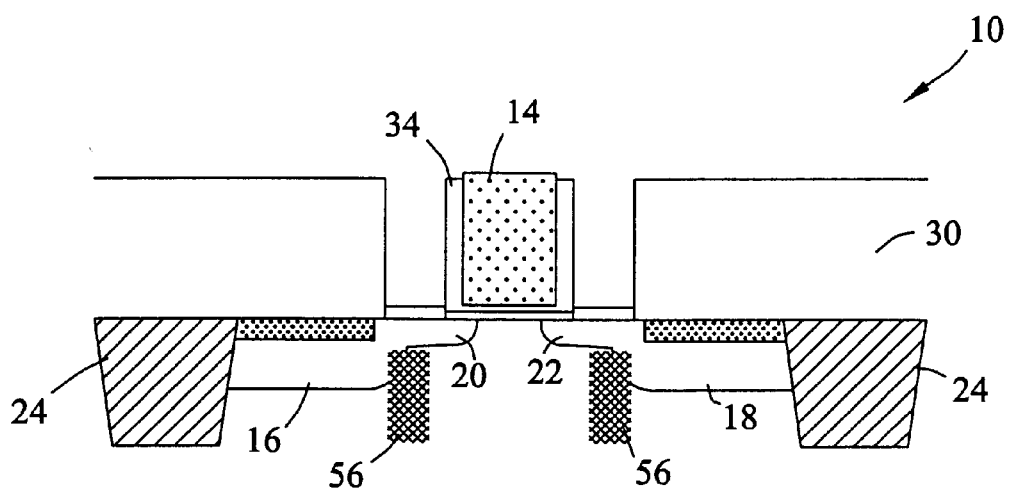
FIG. 7 is a schematic cross-sectional view representation of the portion of the integrated circuit illustrated in FIG. 1, showing an annealing step.

In FIG. 7, a low temperature anneal is performed at a temperature, such as, 500–600° C. Amorphous regions 46 recrystallize to form recrystallized regions 56. Dopants within amorphous regions 46 are well activated due to the anneal. Dopants outside amorphous regions 46 are maintained inactivated. As such, highly defined recrystallized regions 56 can be formed. Recrystallized regions 56 correspond to halo regions 26 described with reference to FIG. 1.

Figure 8:
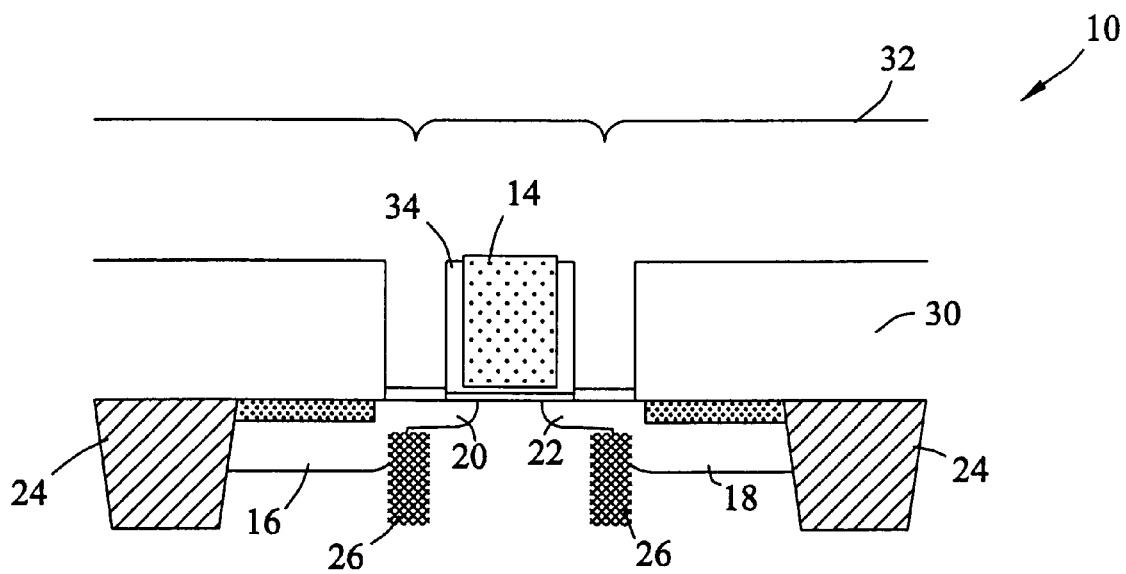
FIG. 8 is a schematic cross-sectional view representation of the portion of the integrated circuit illustrated in FIG. 1, showing a deposition step.

In FIG. 8, oxide layer 32 is deposited. In an exemplary embodiment, oxide layer 32 has a thickness of 3,000–5,000 Angstroms and is formed in a tetraethylorthosilicate (TEOS) process. Referring again to FIG. 1, contacts 28 are formed by removing portions of oxide layer 30 and oxide layer 32.

Advantageously, halo regions 26 are confined locally in the source/channel and drain/channel junction region. The halo implant does not apply to the deep source/drain junction region. As such, halo regions 26 provide suppression of punch-through between the source and drain junctions.

While the embodiments illustrated in the FIGURES and described above are presently preferred, it should be understood that these embodiments are offered by way of example only. Other embodiments may include a variety of different processes for carrying out the functions described. The invention is not limited to a particular embodiment, but extends to various modifications, combinations, and permutations that nevertheless fall within the scope and spirit of the appended claims.

What is claimed is:

1. A method of forming halo regions in an integrated circuit, the method comprising:
   forming dummy spacer structures over an integrated circuit substrate, the dummy spacer structures being located proximate lateral side walls of a gate structure;
   providing an oxide layer over the integrated circuit substrate;
   removing the dummy spacer structures, the removal of the dummy spacer structures resulting in creation of windows in the oxide layer, the windows exposing the integrated circuit substrate;
   providing an amorphization implant through the windows to form amorphous regions in the integrated circuit substrate;
   providing a halo dopant implant through the windows to the amorphous regions; and
   recrystallizating the amorphous regions in the integrated circuit substrate to form halo regions.

2. The method of claim 1, wherein the step of recrystallizing the amorphous regions in the integrated circuit substrate comprises providing a low temperature anneal.

3. The method of claim 2, wherein the low temperature anneal involves temperatures in the range of 500–600 degrees Celsius.

4. The method of claim 1, wherein the halo regions are confined locally in a source/channel junction and a drain/channel junction region.

5. The method of claim 1, wherein the step of providing an amorphization implant is performed before the step of providing a halo implant.

6. The method of claim 1, wherein the step of removing the dummy spacer structures comprises applying a wet etch.

7. The method of claim 1, wherein the step of providing a halo implant is performed after all anneal processes except a low temperature halo implant activation anneal.

8. A method of fabricating an integrated circuit which suppresses punch-through between a source and drain junction using a halo implant activated by a low temperature anneal, the method comprising:
   providing windows in an oxide layer disposed over an integrated circuit substrate, the windows being located over a source and channel junction and a drain and channel junction in the integrated circuit substrate;
   using the windows to implant a species to create amorphous regions in the integrated circuit substrate proximate the source and channel junction and the drain and channel junction;
   using the windows to implant a halo dopant in the created amorphous regions; and
   activating the implanted halo dopant, the activated implanted halo dopant forming halo regions localized near the source and channel junction and the drain and channel junction, whereby the halo regions suppress punch-through effects.

9. The method of claim 8, wherein the step of providing windows in an oxide layer comprises forming structures in areas over the integrated circuit substrate where the windows are desired, depositing the oxide layer over the integrated circuit substrate, removing portions of the oxide layer to the top of the formed structures, and removing the formed structures.

10. The method of claim 9, wherein the structures are spacers located proximate lateral side walls of a gate structure disposed over the integrated circuit substrate.

11. The method of claim 10, wherein the spacers comprise nitride.

12. The method of claim 10, further comprising forming a liner layer along lateral side walls of the gate structure and a surface of the integrated circuit substrate.

13. The method of claim 8, wherein the step of activating the implanted halo implant comprises recrystallizating an amorphous region.

14. The method of claim 8, wherein the step of using the windows to implant a halo implant is performed after all annealing processes except a low temperature activation in the step of activating the implanted halo dopant.

15. A method of forming a highly localized halo profile by a laser thermal process, the method comprising:

forming an integrated circuit portion having source and drain regions in an integrated circuit substrate, a gate structure disposed between the source and drain regions, source and drain extensions extending from the source and drain regions to at least partially under the gate structure, and spacer structures located proximate lateral side walls of the gate structure and over the source and drain extensions;

depositing an oxide layer over the integrated circuit portion;

removing the spacer structures; and forming halo regions localized in the integrated circuit substrate proximate the source and drain extensions, the halo regions having a halo dopant activated by recrystallization of an amorphous region.

16. The method of claim 15, further comprising providing a pre-amorphization implant to create amorphous regions.

17. The method of claim 16, wherein the pre-amorphization implant includes an implant of species Ge, Si, or Sb.

18. The method of claim 16, wherein the pre-amorphization implant is provided before implant of the halo dopant.

19. The method of claim 15, wherein the step of forming halo regions is performed after annealing processes, whereby no additional thermal budget is added to the halo regions.

20. The method of claim 19, wherein the annealing processes preceding the step of forming halo regions are high temperature annealing processes.

* * * * *